United States Patent
Lin et al.

(10) Patent No.: US 8,134,196 B2
(45) Date of Patent: Mar. 13, 2012

(54) INTEGRATED CIRCUIT SYSTEM WITH METAL-INSULATOR-METAL CIRCUIT ELEMENT

(75) Inventors: Yaojian Lin, Singapore (SG); Haijing Cao, Singapore (SG); Wan Lay Looi, Johor Baharu (MY); Eng Seng Lim, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 361 days.

(21) Appl. No.: 11/469,576

(22) Filed: Sep. 1, 2006

(65) Prior Publication Data

US 2007/0108615 A1    May 17, 2007

Related U.S. Application Data (60) Provisional application No. 60/596,161, filed on Sep. 2, 2005.

(51) Int. Cl.
*H01L 29/76* (2006.01)
*H01L 21/8242* (2006.01)

(52) U.S. Cl. .................. 257/306; 438/253; 438/396

(58) Field of Classification Search .......... 257/734, 257/750, 781, 296, 300, 310, E27.084, E27.086, 257/E27.094, E29.342, E29.343, 306
See application file for complete search history.

(56) References Cited

U.S. PATENT DOCUMENTS

| | | | |
|---|---|---|---|
| 5,811,851 A * | 9/1998 | Nishioka et al. | 257/310 |
| 5,943,547 A * | 8/1999 | Yamamichi et al. | 438/3 |
| 6,504,202 B1 | 1/2003 | Allman et al. | |
| 6,686,662 B2 * | 2/2004 | Merchant et al. | 257/751 |
| 6,696,758 B2 * | 2/2004 | Dubin et al. | 257/750 |
| 6,710,425 B2 * | 3/2004 | Bothra | 257/532 |
| 6,720,604 B1 * | 4/2004 | Fritzinger et al. | 257/306 |
| 6,737,353 B2 * | 5/2004 | Fang et al. | 438/652 |
| 6,846,752 B2 | 1/2005 | Chambers et al. | |
| 7,038,266 B2 | 5/2006 | Wang | |
| 7,071,070 B2 | 7/2006 | Gau | |
| 7,084,042 B2 | 8/2006 | Olewine et al. | |
| 7,112,507 B2 | 9/2006 | Kim et al. | |
| 7,235,454 B2 | 6/2007 | Kim et al. | |
| 2004/0036098 A1 * | 2/2004 | Fujiki et al. | 257/296 |

\* cited by examiner

*Primary Examiner* — Hung Vu
(74) *Attorney, Agent, or Firm* — Mikio Ishimaru (57) ABSTRACT

An integrated circuit system is provided including forming a substrate, forming a first contact having multiple conductive layers over the substrate and a layer of the multiple conductive layers on other layers of the multiple conductive layers, forming a dielectric layer on the first contact, and forming a second contact on the dielectric layer and over the first contact.

20 Claims, 4 Drawing Sheets

INTEGRATED CIRCUIT SYSTEM WITH METAL-INSULATOR-METAL CIRCUIT ELEMENT

CROSS-REFERENCE TO RELATED APPLICATION

This application claims the benefit of U.S. Provisional Patent Application Ser. No. 60/596,161 filed Sep. 2, 2005.

TECHNICAL FIELD

The present invention relates generally to integrated circuits and more particularly to molded integrated circuit systems with metal-insulator-metal circuit elements.

BACKGROUND ART

Modern electronics, such as smart phones, personal digital assistants, location based services devices, enterprise class servers, or enterprise class storage arrays, are packing more integrated circuits into an ever shrinking physical space with expectations for decreasing cost. Contemporary electronics expose integrated circuits and packages to more demanding and sometimes new environmental conditions, such as cold, heat, and humidity requiring integrated circuit packages to provide robust structures.

Numerous technologies have been developed to meet these requirements. Some of the research and development strategies focus on new technologies while others focus on improving the existing and mature technologies. Research and development in the existing technologies may take a myriad of different directions. One direction is an increase in integrated circuit density and an integration of more circuit elements with the integrated circuits.

Faster, more reliable, and higher-density circuits, produced at lower cost, are the goals for the entire integrated circuit (IC) industry. Circuit elements, such as capacitors, are used for various integrated circuit applications. For example, making metal-insulator-metal (MIM) capacitors can be used for analog applications, mixed signal (analog/digital circuits) applications, and radio frequency (RF) circuits. These circuit elements, such as capacitors, may also serve as decoupling circuits to provide improved voltage regulation, programmability, and noise immunity.

Previous generations of semiconductor technology, these capacitors are integrated into the integrated circuits when the integrated circuit devices are formed on the substrate. For example, the MIM capacitors may be fabricated using interconnecting metal patterns (e.g., Al/Cu) used to connect the individual integrated circuit elements, such as field effect transistors (FETs).

In the past, metal layers used to fabricate the MIM capacitors and similar circuit elements have typically been a material such as aluminum. However, the temperature coefficient of expansion of aluminum and similarly employed materials leads to parameter control problems. For example, the use of aluminum can result in the formation of bumps or hillocks of various dimensions and configurations making it difficult to control the electrical parameters of capacitors made using it. In addition, formation of hillocks may also destroy or adversely affect the parameters of the circuit elements. These problems lead to yield loss, field failures, reliability problems, or a combination thereof.

Thus, a need still remains for an integrated circuit system providing low cost manufacturing, improved yield, and improved reliability for the MIM circuit elements. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including forming a substrate, forming a first contact having multiple conductive layers over the substrate and a layer of the multiple conductive layers on other layers of the multiple conductive layers, forming a dielectric layer on the first contact, and forming a second contact on the dielectric layer and over the first contact.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "system" means the method and the apparatus of the present invention. The term "processing" as used herein includes deposition of material, patterning, exposure, development, etching, cleaning, molding, and/or removal of the material or as required in forming a described structure.

Figure 1:
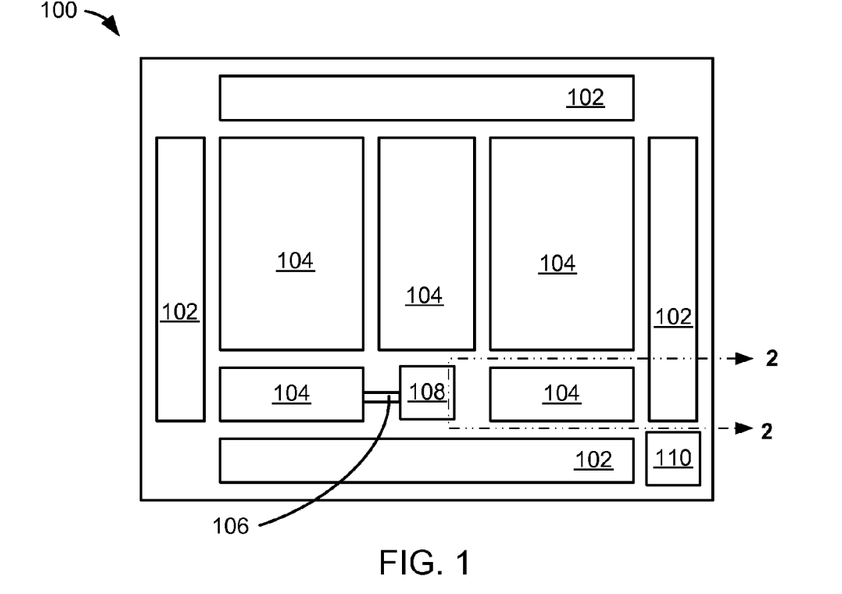
FIG. 1 is a cross-sectional view of an integrated circuit system in an embodiment of the present invention.

Referring now to FIG. 1, therein is shown a top view of an integrated circuit system 100 in an embodiment of the present invention. The integrated circuit system 100 includes external cells 102, such as input/output (I/O) cells, functional blocks 104, and interconnects 106 connecting various elements of the integrated circuit system 100. The integrated circuit system 100 also includes an internal circuit element 108, such as a passive circuit element, and a peripheral circuit element 110, such as a passive circuit element. For illustrative purposes, the integrated circuit system 100 is shown having boundary or peripheral I/O ring, although it is understood that the integrated circuit system 100 may have a different configuration for the external cells 102, such as an array configuration for a land grid array.

System requirements often requires devices, such as the integrated circuit system 100, to interact with various system environments resulting in the integration of various circuit elements, such as circuits for analog or mixed-signal functions. The circuit elements for handling various system environments may reside in the peripheral region with the external cells 102, such as the peripheral circuit element 110. Other circuit elements, such as the internal circuit element 108, may reside within the core area of the integrated circuit system 100.

Figure 2:
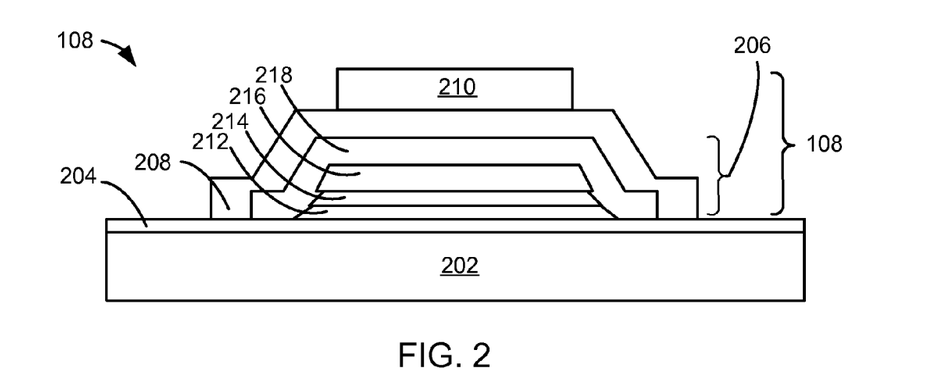
FIG. 2 is a cross-sectional view of the internal circuit element along segment 2-2 of FIG. 1.

Referring now to FIG. 2, therein is shown a cross-sectional view of the internal circuit element 108 along segment 2-2 of FIG. 1. The cross-sectional view may represent other circuit elements of the integrated circuit system 100, such as the peripheral circuit element 110. The cross-sectional view shows the internal circuit element 108, such as a metal-insulator-metal (MIM) capacitor, on a substrate 202, such as a silicon substrate. A passivation layer 204, such as silicon dioxide ($SiO_2$) layer, is over the substrate 202. The internal circuit element 108 is over the passivation layer 204

The internal circuit element 108 has a first contact 206, such as a first electrode, a dielectric layer 208, and a second contact 210, such as a second electrode. The dimensions of the internal circuit element 108 are scaled to predetermined values for the target capacitance value. The structure of the internal circuit element 108 must withstand the integrated circuit manufacturing process without significant yield loss, circuit performance loss, or reliability loss from structural defects, such as hillocks or voids caused by different coefficient of thermal expansion between the structural components of the internal circuit element 108.

The first contact 206 has multiple layers. The first contact 206 includes a first conductive layer 212, a second conductive layer 214, a third conductive layer 216, and a fourth conductive layer 218. The first, second, and third conductive layers 212, 214, and 216 are entirely parallel and entirely planar having upper surfaces and lower surfaces entirely planar and entirely parallel. The first conductive layer 212, such as a layer of aluminum and copper (AlCu), is over a portion of the passivation layer 204. The second conductive layer 214, such as nickel vanadium (NiV), is over the first conductive layer 212. The third conductive layer 216, such as a layer of aluminum and copper (AlCu), is over the second conductive layer 214. The fourth conductive layer 218, such as tantalum silicon (TaSi), covers and is on the first conductive layer 212, the second conductive layer 214, and the third conductive layer 216 as well as a portion of the passivation layer 204.

For illustrative purposes, the first contact 206 is shown having four conductive layers, although it is understood that the number of layers may not be four. Also for illustrative purposes, the first contact 206 is shown having four conductive layers, although it is understood that the layers may not be all conductive.

The dielectric layer 208, such as a silicon nitride layer, is between the first contact 206 and the second contact 210. The dielectric layer 208 covers the first contact 206 and is over the passivation layer 204. The dielectric layer 208 provides the dielectric for the capacitor structure of the internal circuit element 108. For illustrative purposes, the dielectric layer 208 is shown as a uniform region, although it is understood that the dielectric layer 208 may not be uniform, such as contain different materials or multiple layers of the same or different materials.

The second contact 210 is over the dielectric layer 208. The cross-sectional view shows the second contact 210 not extending beyond the width of the third conductive layer 216 to form the structural dimension of the predetermined target capacitance value.

The addition of aluminum in the copper in the first conductive layer 212 and the third conductive layer 216 help reduce the formation of hillocks and voids by limiting the copper grain size. The manufacture process exposes the integrated circuit system 100 to high temperatures, such as 400° C., that may result in formation of hillocks and voids in the copper with aluminum layer.

The second conductive layer 214 may serve as a barrier for hillocks formed in the first conductive layer 212 and reduces the formation of voids in the first conductive layer 212. The hillocks formed in the first conductive layer 212 expends the thermal expansion energy to the second conductive layer 214. This helps control the stress from the thermal expansion energy to the MIM capacitor structure. The density of the hillocks formed in the first conductive layer 212 is also reduced. The dissimilarity of the second conductive layer 214 and the first conductive layer 212 further reduces the grain size that may form in the first conductive layer 212.

The second conductive layer 214 isolates the third conductive layer 216 from the hillocks that may form in the first conductive layer 212. This isolates the thermal expansion energy of the first conductive layer 212 and the third conductive layer 216. This isolation also allows the thickness of the dielectric layer 208 to be scaled to the predetermined target capacitance value, such as above 10 pico Farads (pF). The isolation also alleviates a minimum thickness requirement of the dielectric layer 208 that would be necessary to mitigate the hillock formation in the third conductive layer 216 and the risk of shorting the fourth conductive layer 218 with the second contact 210.

The electrical properties of the first contact 206 having the multiple layers are similar or substantially the same to a uniform layer forming the first contact 206. For example, the series resistance (Rs) from the first conductive layer 212, the second conductive layer 214, and the third conductive layer 216 is similar or substantially the same to the resistance of the first contact 206 of the same thickness formed from AlCu.

It has been discovered that the multiple layers of the first contact 206 allows for the low cost manufacture of integrated circuits with circuit elements, such as MIM capacitors, with higher yield, reliability, and performance without additional equipment.

Figure 3:
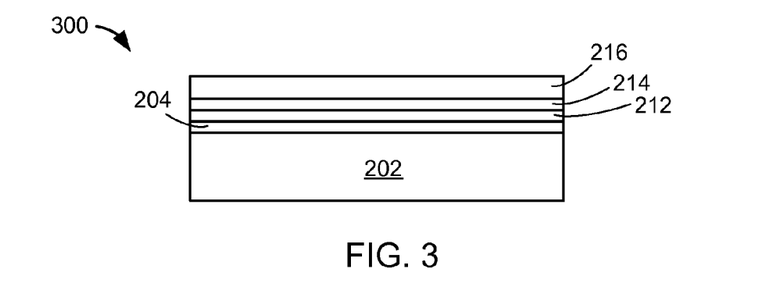
FIG. 3 is a cross-sectional view of a wafer structure in an embodiment of the present invention.

Referring now to FIG. 3, therein is shown a cross-sectional view of a wafer structure 300 in an embodiment of the present invention. The wafer structure 300 includes the integrated circuit system 100 of FIG. 1. The wafer structure 300 includes the substrate 202, such as a silicon substrate, with the passivation layer 204 over the active surface. The first conductive layer 212 is formed over the passivation layer 204. The second conductive layer 214 is formed over the first conductive layer 212. The third conductive layer 216 is formed over the second conductive layer 214. The first conductive layer 212, the second conductive layer 214, and the third conductive layer 216 may be formed over the substrate 202 by a number of processes, such as DC sputtering.

The formation process creates the first conductive layer 212, the second conductive layer 214, and the third conductive layer 216 each having a predetermined thickness. For example, the thickness ratio of the first conductive layer 212, the second conductive layer 214, and the third conductive layer 216 is in the range 15~5:1:5~15 or 5 kÅ for the first conductive layer 212 to 1 kÅ for the second conductive layer 214 to 15 kÅ for the third conductive layer 216. The formation of the first conductive layer 212, the second conductive layer 214, and the third conductive layer 216 provides stress control to withstand further processing of the manufacture of the wafer structure 300. The stack formed by the first conductive layer 212, the second conductive layer 214, and the third conductive layer 216 has a tensile stress in the range of 100 to 600 MPa with a typical value about 300 MPa.

Figure 4:
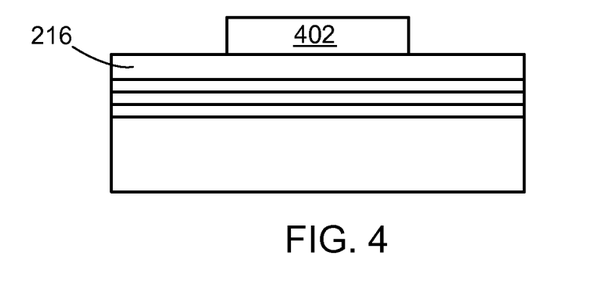
FIG. 4 is a cross-sectional view of the structure of FIG. 3 in a mask phase.

Referring now to FIG. 4, therein is shown a cross-sectional view of the structure of FIG. 3 in a mask phase. A mask 402, such a positive resist mask, is applied on the third conductive layer 216. The mask 402 is patterned to the predetermined dimension of the internal circuit element 108 of FIG. 2.

Figure 5:
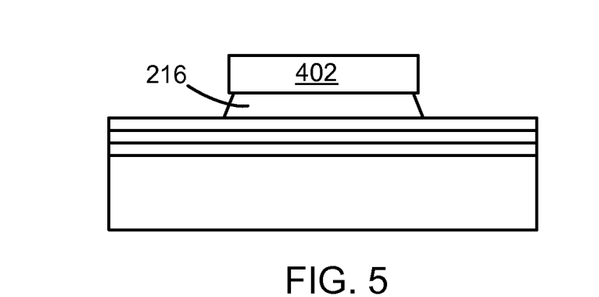
FIG. 5 is a cross-sectional view of the structure of FIG. 4 in a first etch phase.

Referring now to FIG. 5, therein is shown a cross-sectional view of the structure of FIG. 4 in a first etch phase. The third conductive layer 216 is etched forming the third conductive layer 216 for the first contact 206 of FIG. 2 under the mask 402. The etching process may be any number of processes, such as wet etching.

Figure 6:
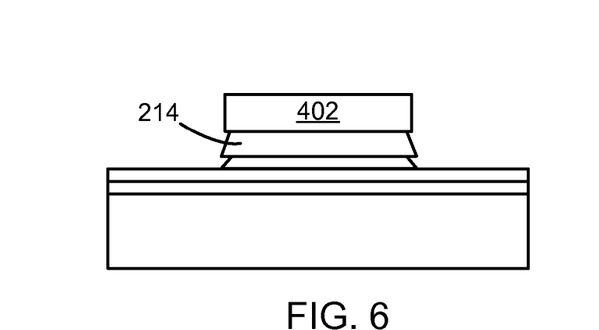
FIG. 6 is a cross-sectional view of the structure of FIG. 5 in a second etch phase.

Referring now to FIG. 6, therein is shown a cross-sectional view of the structure of FIG. 5 in a second etch phase. The second conductive layer 214 is etched forming the second conductive layer 214 of the first contact 206 of FIG. 2 under the mask 402. The etching process may be any number of processes, such as wet etching.

Figure 7:
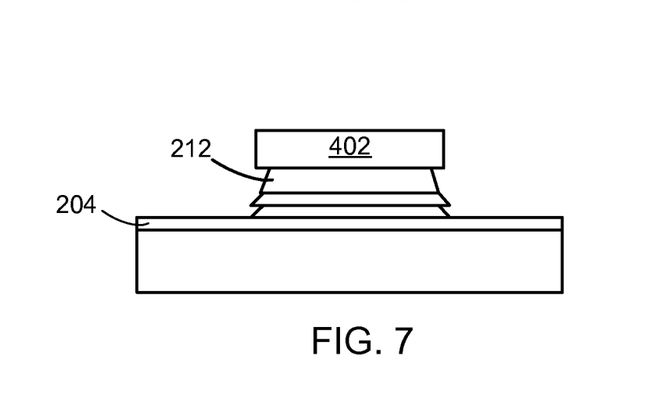
FIG. 7 is a cross-sectional view of the structure of FIG. 6 in a third etch phase.

Referring now to FIG. 7, therein is shown a cross-sectional view of the structure of FIG. 6 in a third etch phase. The first conductive layer 212 is etched forming the first conductive layer 212 for the first contact 206 of FIG. 2 under the mask 402. This phase exposes the passivation layer 204. The etching process may be any number of processes, such as wet etching.

Figure 8:
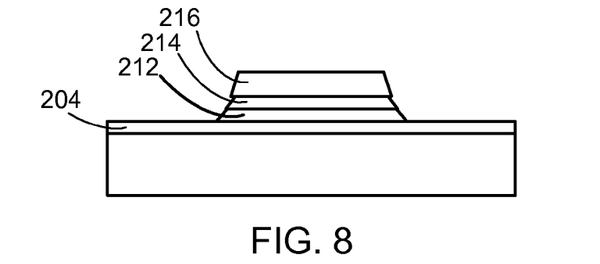
FIG. 8 is a cross-sectional view of the structure of FIG. 7 in a mask removal phase.

Referring now to FIG. 8, therein is shown a cross-sectional view of the structure of FIG. 7 in a mask removal phase. The mask 402 of FIG. 7 is removed leaving the first conductive layer 212, the second conductive layer 214, and the third conductive layer 216 patterned to predetermined dimensions and over the passivation layer 204.

Figure 9:
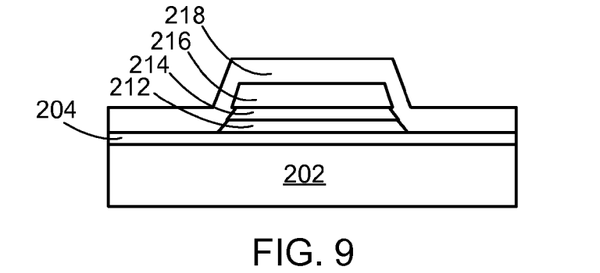
FIG. 9 is a cross-sectional view of the structure of FIG. 8 in a metallization phase.

Referring now to FIG. 9, therein is shown a cross-sectional view of the structure of FIG. 8 in a metallization phase. The fourth conductive layer 218 is formed over the passivation layer 204 as well as on the stack of the first conductive layer 212, the second conductive layer 214, and the third conductive layer 216. The fourth conductive layer 218 may be formed over the substrate 202 by a number of processes, such as DC sputtering.

Figure 10:
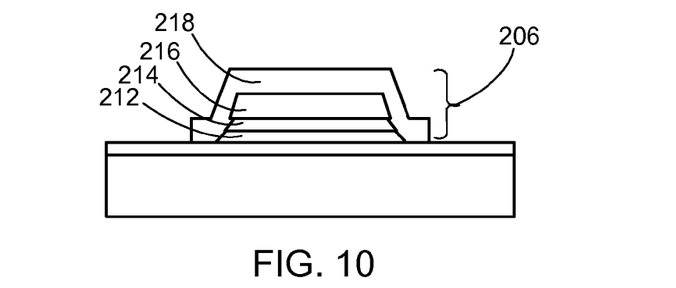
FIG. 10 is a cross-sectional view of the structure of FIG. 9 in a metal pattern phase.

Referring now to FIG. 10, therein is shown a cross-sectional view of the structure of FIG. 9 in a metal pattern phase. The fourth conductive layer 218 is patterned with photolithography to predetermined dimensions of the internal circuit element 108 of FIG. 2. The fourth conductive layer 218 is one the stack of the first conductive layer 212, the second conductive layer 214, and the third conductive layer 216 forming the first contact 206.

Figure 11:
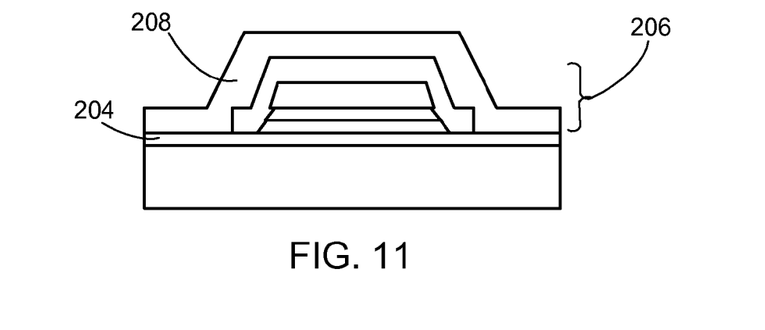
FIG. 11 is a cross-sectional view of the structure of FIG. 10 in a dielectric phase.

Referring now to FIG. 11, therein is shown a cross-sectional view of the structure of FIG. 10 in a dielectric phase. The dielectric layer 208, such as a layer comprised of silicon and nitride ($Si_xN_y$), is formed over the first contact 206 and the passivation layer 204. The process to form the dielectric layer 208 may be by any number of processes, such as plasma enhanced chemical vapor deposition (PECVD).

Figure 12:
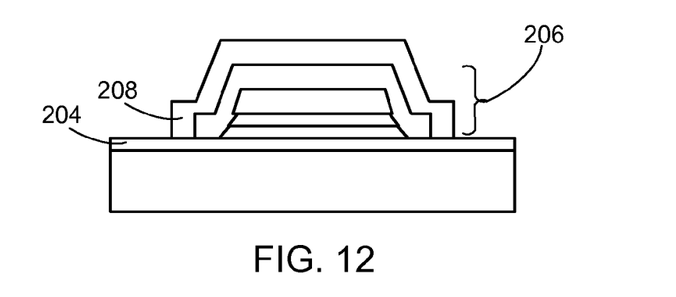
FIG. 12 is a cross-sectional view of the structure of FIG. 11 in a dielectric pattern phase.

Referring now to FIG. 12, therein is shown a cross-sectional view of the structure of FIG. 11 in a dielectric pattern phase. The dielectric layer 208 is patterned with photolithography to predetermined dimensions of the internal circuit element 108 of FIG. 2. The dielectric layer 208 covers the first contact 206. The passivation layer 204 is exposed. The process to form the pattern of the dielectric layer 208 may be by any number of processes, such as dry etching.

Figure 13:
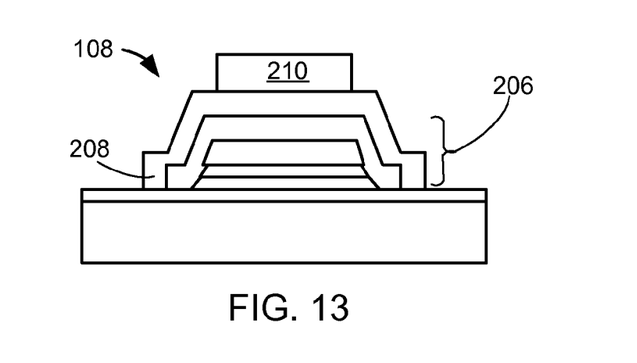
FIG. 13 is a cross-sectional view of the structure of FIG. 12 in another metallization phase.

Referring now to FIG. 13, therein is shown a cross-sectional view of the structure of FIG. 12 in another metallization phase. The metal layer of the second contact 210 is formed over the structure having the dielectric layer 208 over the first contact 206. The metal layer may be formed on the structure of FIG. 12 by any number of processes, such as DC sputtering. Photolithography with wet etching may be used to pattern the metal layer to form the second contact 210 over the dielectric layer 208 and the first contact 206 forming the internal circuit element 108, such as a MIM capacitor.

Figure 14:
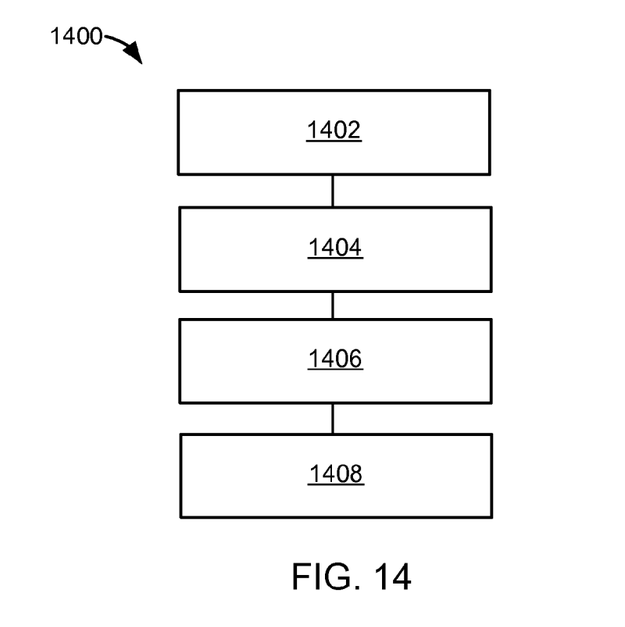
FIG. 14 is a flow chart of an integrated circuit system for manufacture of the integrated circuit system in an embodiment of the present invention.

Referring now to FIG. 14, therein is shown a flow chart of an integrated circuit system 1400 for manufacture of the integrated circuit system 100 in an embodiment of the present invention. The system 1400 includes forming a substrate in a block 1402; forming a first contact having multiple conductive layers over the substrate and a layer of the multiple conductive layers on other layers of the multiple conductive layers in a block 1404; forming a dielectric layer on the first contact in a block 1406; and forming a second contact on the dielectric layer and over the first contact in a block 1408.

It has been discovered that the present invention thus has numerous aspects.

It has been discovered that the present invention provides low cost manufacture of integrated circuits with circuit elements, such as MIM capacitors, with higher yield, reliability, and performance without additional equipment.

An aspect of the present invention provides a first contact having multiple layers to reduce the hillock and void density. This increases the yield of the integrated circuit having the MIM capacitors.

Another aspect of the present invention provides for scaling the MIM capacitor to the desired dimensions and values not previously achievable. The multiple layers of the first contact reduces or eliminates the minimum thickness requirement of the capacitor dielectric that was previously required to compensate for hillocks from the first contact and shorts between the first and second contacts.

Yet another aspect of the present invention is that the defects, such as hillocks and voids, with other circuit elements of the integrated circuit. The invention may be applied to interconnects, other passive elements, and active elements.

Yet another important aspect of the present invention is that it valuably supports and services the historical trend of reducing costs, simplifying systems, increasing yield, increasing reliability, and increasing performance.

These and other valuable aspects of the present invention consequently further the state of the technology to at least the next level.

Thus, it has been discovered that the integrated circuit system method of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit comprising:
    forming a substrate;
    forming a first contact having multiple conductive layers over the substrate and a layer of the multiple conductive layers directly contacts and covers other layers of the multiple conductive layers, wherein the other layers of the multiple conductive layers are entirely planar and the other layers having a first conductive layer, a second conductive layer, and a third conductive layer, with the first conductive layer 15 to 5 times thicker than the second conductive layer and the third conductive layer 5 to 15 times thicker than the second conductive layer;
    forming a dielectric layer on the first contact; and
    forming a second contact on the dielectric layer and over the first contact.

2. The method as claimed in claim 1 wherein forming the first contact having the multiple conductive layers includes forming layers with not all of the same material.

3. The method as claimed in claim 1 wherein forming the first contact having the multiple conductive layers includes:
    forming the first conductive layer over the substrate;
    forming the second conductive layer on the first conductive layer; and
    forming the third conductive layer on the second conductive layer.

4. The method as claimed in claim 1 wherein forming the first contact having the multiple conductive layers includes:
    forming the first conductive layer over the substrate;
    forming the second conductive layer on the first conductive layer;
    forming the third conductive layer on the second conductive layer; and
    forming a fourth conductive layer on the third conductive layer.

5. The method as claimed in claim 1 further comprising forming a metal-insulator-metal capacitor with the first contact connected as a first electrode and the second contact connected as a second electrode.

6. A method of manufacturing an integrated circuit comprising:
    forming a substrate;
    forming a first conductive layer that is entirely planar over the substrate;
    forming a second conductive layer that is entirely planar on the first conductive layer with the second conductive layer 15 to 5 times thinner than the first conductive layer;
    forming a third conductive layer that is entirely planar on the second conductive layer with the third conductive layer 5 to 15 times thicker than the second conductive layer;
    forming a fourth conductive layer directly contacting and covering the third conductive layer, the second conductive layer, and the first conductive layer;
    forming a dielectric layer on the fourth conductive layer; and
    forming an electrode on the dielectric layer and over the third conductive layer.

7. The method as claimed in claim 6 wherein:
    forming the first conductive layer includes forming the first conductive layer comprised of copper and aluminum; and
    forming the third conductive layer includes forming the third conductive layer comprised of copper and aluminum.

8. The method as claimed in claim 6 wherein forming the second conductive layer includes forming a layer comprised of nickel and vanadium.

9. The method as claimed in claim 6 wherein forming the fourth conductive layer includes forming a layer comprised of tantalum and silicon.

10. The method as claimed in claim 6 wherein forming the electrode includes forming the electrode comprised of copper and aluminum.

11. An integrated circuit system comprising:
    a substrate;
    a first contact having multiple conductive layers over the substrate and a layer of the multiple conductive layers directly contacts and covers other layers of the multiple conductive layers, wherein the other layers of the multiple conductive layers are entirely planar and the other layers having a first conductive layer, a second conductive layer, and a third conductive layer, with the first conductive layer 15 to 5 times thicker than the second conductive layer and the third conductive layer 5 to 15 times thicker than the second conductive layer;
    a dielectric layer on the first contact; and
    a second contact on the dielectric layer and over the first contact.

12. The system as claimed in claim 11 wherein the first contact having the multiple conductive layers has layers with not all of the same material.

13. The system as claimed in claim 11 wherein the first contact having the multiple conductive layers has:
    the first conductive layer over the substrate;
    the second conductive layer on the first conductive layer; and
    the third conductive layer on the second conductive layer.

14. The system as claimed in claim 11 wherein the first contact having the multiple conductive layers has:
    the first conductive layer over the substrate;
    the second conductive layer on the first conductive layer;

the third conductive layer on the second conductive layer; and a fourth conductive layer on the third conductive layer.

15. The system as claimed in claim 11 further comprising a metal-insulator-metal capacitor with the first contact connected as a first electrode and the second contact connected as a second electrode.

16. The system as claimed in claim 11 wherein:

the substrate is a silicon substrate;

the first contact having a fourth conductive layer with the fourth conductive layer directly contacting and covering the first conductive layer, the second conductive layer, and the third conductive layer;

the dielectric layer is comprised of silicon and nitrogen on the first contact; and the second contact is an electrode on the dielectric layer and over the third conductive layer.

17. The system as claimed in claim 16 wherein the first conductive layer and the third conductive layer are comprised of copper and aluminum.

18. The system as claimed in claim 16 wherein the second conductive layer is comprised of nickel and vanadium.

19. The system as claimed in claim 16 wherein the fourth conductive layer is comprised of tantalum and silicon.

20. The system as claimed in claim 16 wherein the electrode is comprised of copper and aluminum.

* * * * *

UNITED STATES PATENT AND TRADEMARK OFFICE
CERTIFICATE OF CORRECTION

PATENT NO. : 8,134,196 B2  Page 1 of 1
APPLICATION NO. : 11/469576
DATED : March 13, 2012
INVENTOR(S) : Lin et al.

It is certified that error appears in the above-identified patent and that said Letters Patent is hereby corrected as shown below:

Column 5:
line 28-30, delete "or 5 kA for the first conductive layer 212 to 1 kA for the second conductive layer 214 to 15 kA for" and insert therefor --or 5kA for the first conductive layer 212 to 1kA for the second conductive layer 214 to 15kA for-- line 37, delete "600 MPa with a typical value about 300 MPa." and insert therefor --600MPa with a typical value about 300MPa.--

Signed and Sealed this
Ninth Day of October, 2012

David J. Kappos
*Director of the United States Patent and Trademark Office*